United States Patent
Tu et al.

(10) Patent No.: US 6,309,957 B1
(45) Date of Patent: Oct. 30, 2001

(54) METHOD OF LOW-K/COPPER DUAL DAMASCENE

(75) Inventors: An-Chun Tu, Taipei; Shih-Kuan Tai, Po-Tzu; Tzu-Shih Yeu, Hsin-Chiu, all of (TW)

(73) Assignee: Taiwan Semiconductor Maufacturing Company, Hsin-chu (TW)

( * ) Notice: Subject to any disclaimer, the term of this patent is extended or adjusted under 35 U.S.C. 154(b) by 0 days.

(21) Appl. No.: 09/541,489

(22) Filed: Apr. 3, 2000

(51) Int. Cl.[7] .................................................. H01L 21/4763
(52) U.S. Cl. ................................................................ 438/622
(58) Field of Search ...................................... 438/584, 622, 438/624, 625, 638, 637, 645, 647, 687

(56) References Cited

U.S. PATENT DOCUMENTS

| | | | |
|---|---|---|---|
| 5,512,514 | 4/1996 | Lee | 437/195 |
| 5,691,238 | 11/1997 | Avanzino et al. | 437/195 |
| 5,693,568 | 12/1997 | Liu et al. | 437/195 |
| 5,705,430 | * 1/1998 | Avanzino et al. | 437/195 |
| 5,795,823 | 8/1998 | Avanzino et al. | 438/639 |
| 5,981,374 | 11/1999 | Dalal et al. | 438/624 |
| 6,187,663 | * 2/2001 | Yu et al. | 438/624 |

* cited by examiner

*Primary Examiner*—David Nelms
*Assistant Examiner*—Que Hoag
(74) *Attorney, Agent, or Firm*—George O. Saile; Stephen B. Ackerman

(57) ABSTRACT

This invention relates to a method of fabrication used for semiconductor integrated circuit devices, and more specifically to both dual and single inverse copper damascene processes to form conducting copper interconnects and contact vias simultaneously, with low dielectric constant intermetal dielectrics (IMD). The low dielectric constant material, low-K, can be of four types of material: doped oxide, organic materials, highly fluorinated films, porous materials. In addition, spin-on glass (SOG) and spin-on-dielectric (SOD) are applicable. Key to the present invention are the following process steps, that have exceptionally advanced process controls: polysilicon etching of sacrificial polysilicon, plasma ashing of the patterning photoresist, and post cleaning. With conventional dual damascene, wherein dielectric material is patterned into dual damascene, several deleterious effects occur: (1) etching of low-K material can be difficult and can affect the electrical properties, (2) photoresist ashing can impact both the dielectric constant of low-K material and critical dimensional bias control, (3) post cleaning can impact the dielectric constant of low-K material. Using both the inverse dual and single damascene processes disclosed by this invention, the problems associated with convention damascene approaches are circumvented.

26 Claims, 3 Drawing Sheets

METHOD OF LOW-K/COPPER DUAL DAMASCENE

BACKGROUND OF THE INVENTION (1) Field of the Invention

This invention relates to a method of fabrication used for semiconductor integrated circuit devices, and more specifically to both dual and single inverse copper damascene processes to form conducting copper interconnects and contact vias, simultaneously, with low dielectric constant intermetal dielectrics (IMD).

(2) Description of Related Art

As an introduction and background to Prior Art, the conventional dual damascene process scheme is commonly used to fabricate of copper interconnects, trench, and contact vias. Dual Damascene wiring interconnects (and/or studs) are formed by depositing one or two dielectric layers on a planar surface, patterning it using photolithography and dielectric reactive ion etch (RIE), then filling the recesses with conductive copper metal. The excess metal is removed by chemical mechanical polishing (CMP), while the troughs or channels remain filled with inlaid metal. With the dual damascene process, two layers of metal are formed as one, i.e., wiring line and contact stud vias, avoiding an interface between the layers.

Related Prior Art background patents will now be described in this section.

U.S. Pat. No. 5,512,514 entitled "Self-Aligned Via and Contact Interconnect Manufacturing Method" granted Apr. 30, 1996 to Lee shows an inverse interconnect process where the line is patterned and then the intermetal dielectric (IMD) layer is formed there're. Described is an integral via structure and contact manufacturing process with a first conductive layer patterning process section that includes: depositing a first conductive layer, creating a first via etch mask on the first conductive layer, and through a series of process steps, formed is a first conductive pattern having integral via structure. A second conductive layer is patterned in the same manner as the first conductive layer to create a second conductive pattern with integral second via structures. A second dielectric layer is deposited and planarized in the same manner as the first dielectric exposing the second via structures. A third conductive layer is deposited, making contact with the second via structures and patterned with convention methods to create a third conductive pattern.

U.S. Pat. No. 5,981,374 entitled "Sub-Half-Micron Multi-Level Interconnection Structure and Process Thereof" granted Nov. 9, 1999 to Dalal et al. teaches an interconnect process and structure for sub-half-micron multi-level IC interconnects. The structure and process are reported to improve circuit performance, reliability and process yields. The inventive structure and process have a plurality of insulator layers where each of the adjoining insulator layers are of a different material.

U.S. Pat. No. 5,693,568 entitled "Reverse Damascene Via Structures" granted Dec. 2, 1997 to Liu et al. shows a reverse dual damascene process. An interconnection pattern is formed by depositing first and second conductive layers, etching to form a conductive pattern in the first conductive layer and etching to form an interconnection comprising a portion of the second conductive layer. The need to form openings in dielectric layers, and filling them with barrier materials and plugs, is avoided.

U.S. Pat. No. 5,705,430 entitled "Dual Damascene with a Sacrificial Via Fill" granted Jan. 6, 1998 to Avanzino et al. describes a dual damascene method of fabricating an interconnection level of conductive lines and connecting vias separated by insulation for integrated circuits and substrate carriers for semiconductor devices using a sacrificial via fill. A first layer of insulating material is formed with via openings. The openings are filled with a sacrificial removable material. A second layer of insulating material is deposed on the first layer. In one embodiment, the etch selectivity to the etchant of the second layer is essentially the same as the sacrificial via fill and, preferably, is substantially higher than second layer. Using a conductive line pattern aligned with the via openings, conductive line openings are etched in the second insulating layer and, during etching, the sacrificial fill is removed from the via openings. In a second embodiment, the sacrificial material is not etch-able by the etchant for forming the conductive line openings and, after formation of the conductive line openings, the sacrificial material is removed with an etchant to which the first insulating layer is resistive or less selective. A conductive material now is deposited in the conductive line and via openings.

U.S. Pat. No. 5,691,238 entitled "Subtractive Dual Damascene" granted Nov. 25, 1997 to Avanzino et al. describes a method of fabricating an interconnection level of conductive lines and connecting vias separated by insulation for integrated circuits and substrate carriers for semiconductor devices using a reverse damascene in the formation of the conductive lines and vias. A conductive line pattern is first used to etch completely through the layer to form conductive line openings. The openings are completely filled with a conductive material and planarized so that the surfaces of the conductive material and the insulating layer are coplanar. A via pattern is aligned perpendicular to the conductive lines and the conductive material is etched half way through the conductive lines in other than the areas covered by the via pattern. The openings thus created in the upper portion of the conductive lines are filled with insulating material to complete the dual damascene interconnection level with the conductive lines in the lower portion of the insulating layer and upwardly projecting vias in the upper portion of the layer. In addition, a triple damascene layer is formed by starting with an insulating layer about one-third thicker than normal and by combining the standard dual damascene method with the above described method. The resulting interconnection level structure comprises conductive lines having upwardly and downwardly projecting vias.

U.S. Pat. No. 5,795,823 entitled "Self Aligned Via Dual Damascene" granted Aug. 18, 1998 to Avanzino et al. discloses a method of fabricating an interconnection level of conductive lines and connecting vias separated by insulation for integrated circuits and substrate carriers for semiconductor devices using dual damascene with only one mask pattern for the formation of both the conductive lines and vias. The mask pattern of conductive lines contains laterally enlarged areas where the via openings are to formed in the insulating material. After the conductive line openings with laterally enlarged areas are created, the openings are filled with a conformal material whose etch selectivity is substantially less than the etch selectivity of the insulating material to the etchant for etching the insulating material and whose etch selectivity is substantially greater than the insulating material to its etchant. The conformal material is anisotropically etched to form sidewalls in the enlarged area and remove the material between the sidewalls but leave material remaining in the parts of the conductive lines openings. The sidewalls serve as self aligned mask for etching via openings. The conformal material is either a conductive material which is left in place after the via openings are formed or an insulating material which is removed. In the former, the partially filled conductive line openings are filled with additional conductive material along with the via, which is either the same or different conductive material. In the latter, the conductive line openings and vias are filled with the same conductive material.

SUMMARY OF THE INVENTION

This invention relates to a method of fabrication used for semiconductor integrated circuit devices, and more specifically to both dual and single inverse copper damascene processes to form conducting copper interconnects and contact vias, simultaneously, with low dielectric constant intermetal dielectrics (IMD).

The main embodiment of the present invention is the formation of an inverse dual damascene and subsequent metal fill. Provided is a semiconductor substrate with a an insulating layer, an interlevel dielectric (ILD). Copper interconnects and metal barrier layer are deposited, patterned and the copper interconnect is embedded within a provided insulating layer. The first process step in forming the inverse dual damascene, of this invention, is the deposition of a polysilicon sacrificial blanket layer. This sacrificial polysilicon layer is patterned and etched to form polysilicon islands over the copper interconnects. In addition, these islands or "plugs" can be made of other sacrificial materials besides polysilicon, e.g., silicon nitride or metal.

Low dielectric constant, low K, material is deposited and fills the space in-between the polysilicon islands. The excess polysilicon and low dielectric constant material is chemical mechanical polished (CMP) and the surface is planarized.

Another polysilicon sacrificial blanket layer is deposited. This sacrificial polysilicon layer is patterned and etched to form polysilicon lines over the sacrificial polysilicon islands and over the planarized low dielectric constant material. In addition, these polysilicon lines can be made of other sacrificial materials besides polysilicon, e.g., silicon nitride or metal.

Low dielectric constant, low K, material is deposited over the first low dielectric constant layer and fills the space in-between the polysilicon lines. The excess polysilicon and low dielectric constant material is chemical mechanical polished (CMP) and the surface is planarized.

In this key process step, all of the sacrificial material is removed by patterning and selectively etching the sacrificial material, polysilicon lines and islands or "plugs", leaving behind trench interconnect line openings and contact via openings, in the low dielectric constant material layer. At this point in the process, a dual damascene structure is formed to be subsequently filled with metal. Note, the following key process steps have exceptionally advanced process controls, for unusually high quality control and yield: polysilicon etching, plasma ashing of patterning photoresist, and post cleaning.

In this set of process steps, the dual damascene structure consisting of trench interconnect line opening and contact via opening is filled with conducting metal. Firstly, a conductive metal barrier layer, which is a trench and via liner, is blanket deposited. Next, the conductive copper metal is blanket deposited and the excess copper metal and top surface barrier metal are polished back by chemical mechanical polishing (CMP) forming conducting copper interconnects and contact vias, simultaneously.

Another embodiment of the present invention is the formation of an inverse single damascene and subsequent metal fill. Provided is a semiconductor substrate with a an insulating layer, an interlevel dielectric (ILD). Copper interconnects and metal barrier layer are deposited, patterned and the copper interconnect is embedded within a provided insulating layer. The first process step in forming the inverse single damascene, of this invention, is the deposition of a polysilicon sacrificial blanket layer. This sacrificial polysilicon layer is patterned and etched to form polysilicon islands over the copper interconnects. In addition, these islands or "plugs" can be made of other sacrificial materials besides polysilicon, e.g., silicon nitride or metal.

Low dielectric constant, low K, material is deposited and fills the space in-between the polysilicon islands. The excess polysilicon and low dielectric constant material is chemical mechanical polished (CMP) and the surface is planarized.

In this key process step, the sacrificial material is removed by patterning and selectively etching the sacrificial material, polysilicon islands or "plugs", leaving behind contact via openings, in the low dielectric constant material layer. At this point in the process, a single damascene structure is formed to be subsequently filled with metal. Note, the following key process steps have exceptionally advanced process controls, for unusually high quality control and yield: polysilicon etching, plasma ashing of patterning photoresist, and post cleaning.

In this set of process steps, the single damascene structure consisting of a contact via opening and is filled with conducting metal. Firstly, a conductive metal barrier layer, which is via liner, is blanket deposited. Next, the conductive copper metal is blanket deposited and the excess copper metal and top surface barrier metal are polished back by chemical mechanical polishing (CMP) forming the conducting copper contact vias.

Another copper metal deposition technique, besides typical sputtering techniques, has been adapted as a standard for copper metallization. This technique is electrochemical deposition (ECD) of copper. The electrochemical copper deposition (ECD) still needs, e.g., sputtering techniques, physical vapor deposition (PVD), to deposit thin underlying diffusion barrier film (Ta,TaN) and a conductive "seed" layer of copper.

The low dielectric constant material, low-K, can be selected from the group consisting of four types of material: doped oxide, organic materials, highly fluorinated films, porous materials. In addition, spin-on glass (SOG), chemical vapor deposited (CVD) glass and spin-on-dielectric (SOD) are also applicable. The low dielectric constant material layers are in the thickness range from approximately 3,000 to 5,000 Angstroms thick for each layer.

Several processing details for both inverse dual and inverse single damascene processes are outlined as follows. The sacrificial polysilicon etching process is selected from the group consisting of dry etching, reactive ion etching (RIE), inductively coupled plasma (ICP) and with etch selectively, sacrificial material to background low dielectric material, being greater than thirty to one. The photoresist ashing process is selected from the group consisting of inductively coupled plasma (ICP), plasma etching. The post cleaning process is selected from the group consisting of wet cleaning. Sacrificial material is removed by the following process, selected from the group consisting of chemical dry etching, wet etching and spin-process etching.

In summary, the inverse dual damascene wiring lines with low dielectric constant insulation can be used to form bit lines in DRAM devices, with processing similar to the formation of W studs in the logic and DRAM devices. Key to the present invention are the following process steps that have exceptionally advanced process controls, for unusually high quality control and yield: polysilicon etching, plasma ashing of the patterning photoresist, and post cleaning; whereas with conventional dual damascene, these process areas are not well controlled. For example, with conventional dual damascene, wherein dielectric material is patterned into dual damascene, several deleterious effects occur: (1) etching of low-K material can be difficult and can affect the electrical properties, i.e., dielectric constant, fixed charge, mobile charge, interface states, (2) photoresist ashing can impact both the dielectric constant of low-K material and critical dimensional bias control (3) post cleaning can impact the dielectric of low-K material.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

This invention relates to a method of fabrication used for semiconductor integrated circuit devices, and more specifically to both dual and single inverse copper damascene processes to form conducting copper interconnects and contact vias, simultaneously, with low dielectric constant intermetal dielectrics (IMD).

Figure 1A:
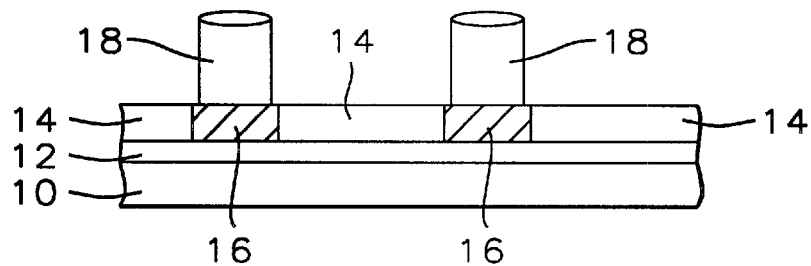
FIGS. 1A–1F, which in cross-sectional representation with three dimensional rendering, illustrate the method of the main embodiments of the present invention, the formation of an inverse dual damascene with low dielectric constant material and subsequent metal fill.

Referring to FIGS. 1A–1F, which in cross-sectional representation with three dimensional rendering, illustrate the method of the main embodiments of the present invention, the formation of an inverse dual damascene and subsequent metal fill. More specifically referring to FIG. 1A, provided is a semiconductor substrate 10 with a an insulating layer 12, an interlevel dielectric (ILD). Copper interconnects 16 and metal barrier layer (not shown) are deposited, patterned and the copper interconnect is embedded within a provided insulating layer 14. The first process step in forming the inverse dual damascene, of this invention, is the deposition of a polysilicon sacrificial blanket layer. This sacrificial polysilicon layer is patterned and etched to form polysilicon islands 18, over copper interconnects 16. In addition, these islands or "plugs" can be made of other sacrificial materials besides polysilicon, e.g., silicon nitride or metal.

Figure 1B:
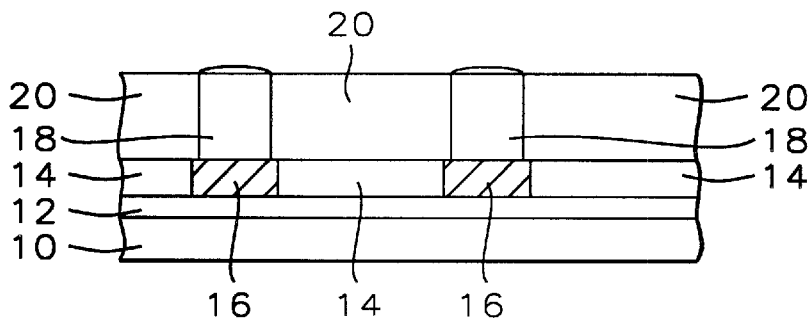

Referring to FIG. 1B, which in cross-sectional representation with three dimensional rendering, illustrates the continuation of the inverse damascene process with low dielectric constant material. Low dielectric constant, low K, material 20 is deposited and fills the space in-between the polysilicon islands 18. The excess polysilicon and low dielectric constant material is chemical mechanical polished (CMP) and the surface is planarized, as shown in FIG. 1B.

Figure 1C:
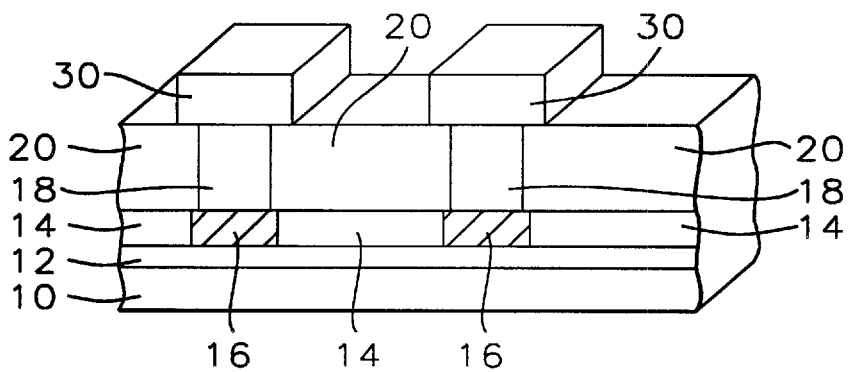

Referring to FIG. 1C, which in cross-sectional representation with three dimensional rendering, illustrates the continuation of the inverse damascene process with low dielectric constant material. Another polysilicon sacrificial blanket layer is deposited. This sacrificial polysilicon layer is patterned and etched to form polysilicon lines 30, over the sacrificial polysilicon islands 18 and over the planarized low dielectric constant material 20. In addition, these polysilicon lines can be made of other sacrificial materials besides polysilicon, e.g., silicon nitride or metal.

Figure 1D:
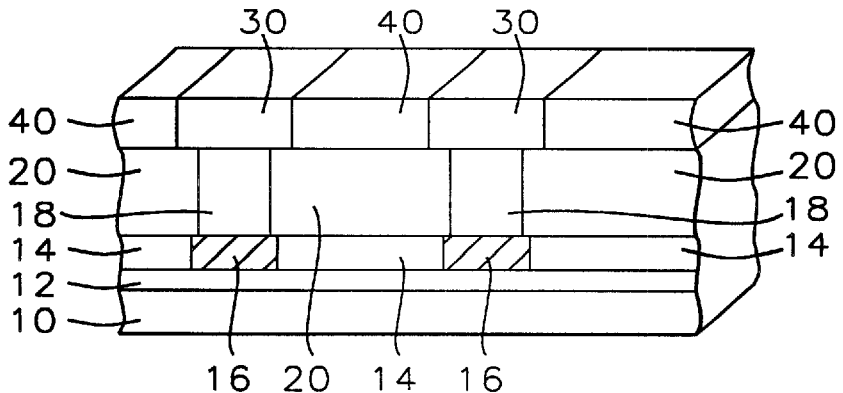

Referring to FIG. 1D, which in cross-sectional representation with three dimensional rendering, illustrates the continuation of the inverse damascene process with low dielectric constant material. Low dielectric constant, low K, material 40 is deposited over the first low dielectric constant layer 20 and fills the space in-between the polysilicon lines 30. The excess polysilicon and low dielectric constant material 40 is chemical mechanical polished (CMP) and the surface is planarized, as shown in FIG. 1D.

Figure 1E:
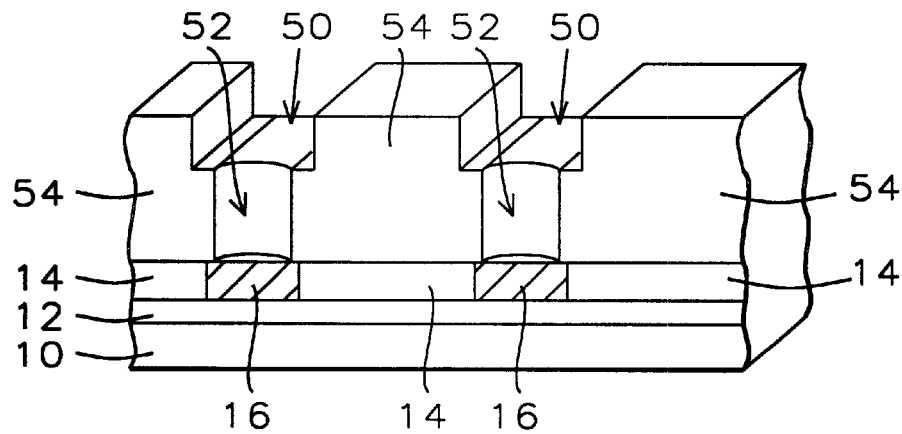

Referring to FIG. 1E, which in cross-sectional representation with three dimensional rendering, illustrates the continuation of the inverse damascene process with low dielectric constant material. In this key process step, all of the sacrificial material is removed by patterning and selectively etching the sacrificial material, polysilicon lines and islands or "plugs", leaving behind trench interconnect line openings 50 and contact via openings 52, in the low dielectric constant material layer 54. At this point in the process, a dual damascene structure is formed to be subsequently filled with metal. Note, the following key process steps have exceptionally advanced process controls, for unusually high quality control and yield: polysilicon etching, plasma ashing of patterning photoresist, and post cleaning.

Several processing details for the inverse dual damascene process are outlined as follows. The sacrificial polysilicon etching process is selected from the group consisting of dry etching, reactive ion etching (RIE), inductively coupled plasma (ICP) and with etch selectively, sacrificial material to background low dielectric material, being greater than thirty to one. The photoresist ashing process is selected from the group consisting of inductively coupled plasma (ICP), plasma etching. The post cleaning process is selected from the group consisting of wet cleaning. Sacrificial material is removed by the following process, selected from the group consisting of chemical dry etching, wet etching and spin-process etching.

Figure 1F:
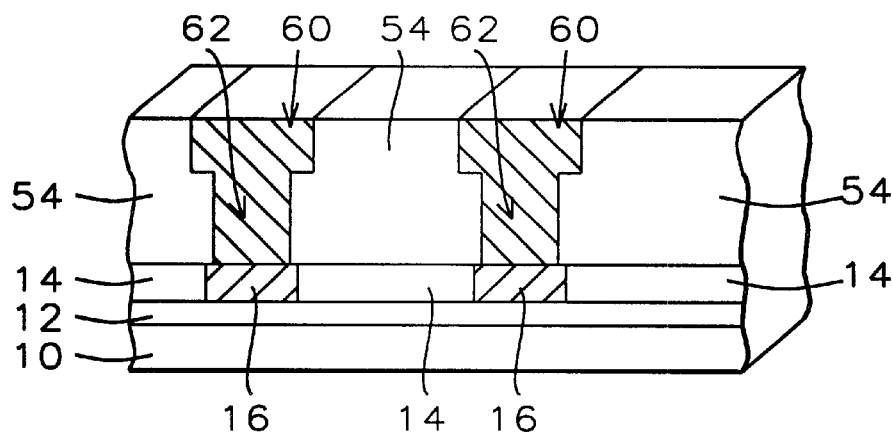

Referring to FIG. 1F, which in cross-sectional representation with three dimensional rendering, illustrates the continuation of the inverse damascene process with low dielectric constant material. In this set of process steps, the dual damascene structure consisting of trench interconnect line opening and contact via opening is filled with conducting metal. Firstly, a conductive metal barrier layer (not shown), which is a trench and via liner, is blanket deposited. Next, the conductive copper metal is blanket deposited and the excess copper metal and top surface barrier metal are polished back by chemical mechanical polishing (CMP) forming conducting copper interconnects 60 and contact vias 62, simultaneously.

Figure 2A:
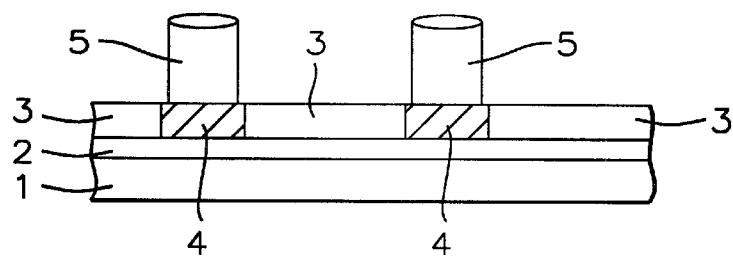
FIGS. 2A–2D, which in cross-sectional representation illustrate the method of another embodiment of the present invention, the formation of an inverse single damascene with low dielectric constant material and subsequent metal fill.

Referring to FIGS. 2A–2D, which in cross-sectional representation illustrate the another embodiment of the present invention, the formation of an inverse single damascene and subsequent metal fill. More specifically referring to FIG. 2A, provided is a semiconductor substrate 1 with a an insulating layer 2, an interlevel dielectric (ILD). Copper interconnects 4 and metal barrier layer (not shown) is deposited, patterned and is embedded within a provided insulating layer 3. The first process step in forming the inverse single damascene, of this invention, is the deposition of a polysilicon sacrificial blanket layer. This sacrificial polysilicon layer is patterned and etched to form polysilicon islands 5, over copper interconnects 4. In addition, these islands or "plugs" can be made of other sacrificial materials besides polysilicon, e.g., silicon nitride or metal.

Figure 2B:
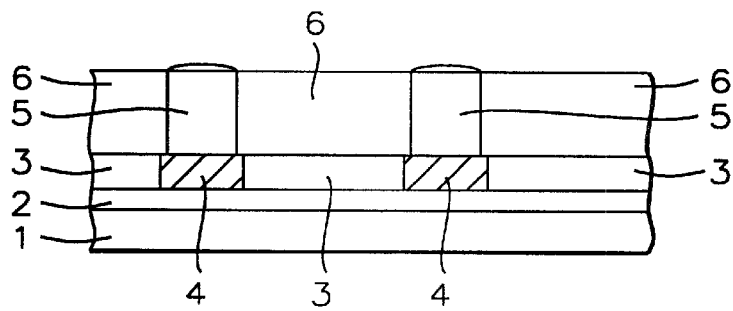

Referring to FIG. 2B, which in cross-sectional representation with three dimensional rendering, illustrates the continuation of the inverse single damascene process with low dielectric constant material. Low dielectric constant, low K, material 6 is deposited and fills the space in-between the polysilicon islands 5. The excess polysilicon and low dielectric constant material is chemical mechanical polished (CMP) and the surface is planarized.

Figure 2C:
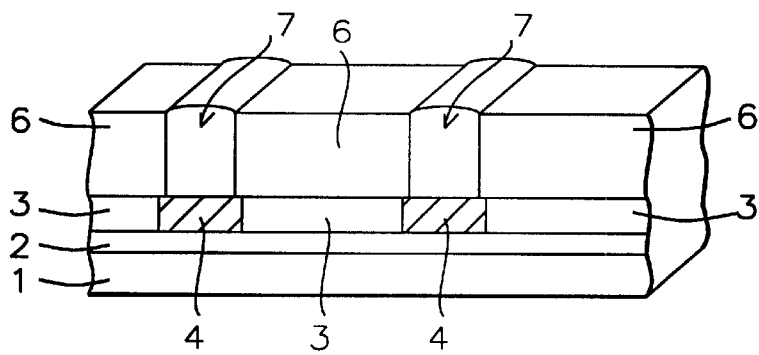

Referring to FIG. 2C, which in cross-sectional representation with three dimensional rendering, illustrates the continuation of the inverse single damascene process with low dielectric constant material. In this key process step, the sacrificial material is removed by patterning and selectively etching the sacrificial material, polysilicon islands or "plugs", leaving behind contact via openings 7, in the low dielectric constant material layer 6. At this point in the process, a single damascene structure is formed to be subsequently filled with metal. Note, the following key process steps have exceptionally advanced process controls, for unusually high quality control and yield: polysilicon etching, plasma ashing of patterning photoresist, and post cleaning.

Several processing details for the inverse single damascene process are outlined as follows, similar to the techniques described before for the inverse dual damascene. The sacrificial polysilicon etching process is selected from the group consisting of dry etching, reactive ion etching (RIE), inductively coupled plasma (ICP) and with etch selectively, sacrificial material to background low dielectric material, being greater than thirty to one. The photoresist ashing process is selected from the group consisting of inductively coupled plasma (ICP), plasma etching. The post cleaning process is selected from the group consisting of wet cleaning. Sacrificial material is removed by the following process, selected from the group consisting of chemical dry etching, wet etching and spin-process etching.

Figure 2D:
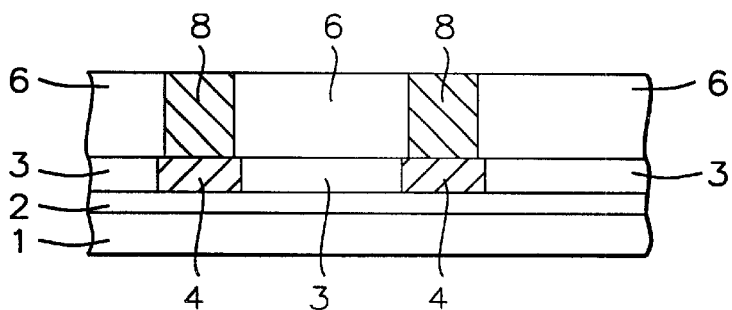

Referring to FIG. 2D, which in cross-sectional representation illustrates the continuation of the inverse single damascene process with low dielectric constant material. In this set of process steps, the single damascene structure consisting of a contact via opening and is filled with conducting metal. Firstly, a conductive metal barrier layer (not shown), which is via liner, is blanket deposited. Next, the conductive copper metal is blanket deposited and the excess copper metal and top surface barrier metal are polished back by chemical mechanical polishing (CMP) forming the conducting copper contact vias 8.

Another copper metal deposition technique, besides typical sputtering techniques, has been adapted as a standard for copper metallization. This technique is electrochemical deposition (ECD) of copper. The electrochemical copper deposition (ECD) still needs, e.g., sputtering techniques, physical vapor deposition (PVD), to deposit thin underlying diffusion barrier film (Ta,TaN) and a conductive "seed" layer of copper.

The low dielectric constant material, low-K, can be selected from the group consisting of four types of material: doped oxide, organic materials, highly fluorinated films, porous materials. In addition, spin-on glass (SOG), chemical vapor deposited (CVD) glass and spin-on-dielectric (SOD) are also applicable. The low dielectric constant material layers are in the thickness range from approximately 3,000 to 5,000 Angstroms thick for each layer.

In summary, the inverse dual damascene wiring lines with low dielectric constant insulation can be used to form bit lines in DRAM devices, with processing similar to the formation of W studs in the logic and DRAM devices. Key to the present invention are the following process steps that have exceptionally advanced process controls, for unusually high quality control and yield: polysilicon etching, plasma ashing of the patterning photoresist, and post cleaning; whereas with conventional dual damascene, these process areas are not well controlled. For example, with conventional dual damascene, wherein dielectric material is patterned into dual damascene, several deleterious effects occur: (1) etching of low-K material can be difficult and can affect the electrical properties, i.e., dielectric constant, fixed charge, mobile charge, interface states, (2) photoresist ashing can impact both the dielectric constant of low-K material and critical dimensional bias control (3) post cleaning can impact the dielectric of low-K material.

While the invention has been particularly shown and described with reference to the preferred embodiments thereof, it will be understood by those skilled in the art that various changes in form and details may be made without departing from the spirit and scope of the invention.

What is claimed is:

1. A method for fabricating conductive inlaid copper interconnects and contact vias for applications in MOSFET and CMOS semiconductor devices using an inverse copper dual damascene comprising:

providing a substrate over which is formed an interlevel dielectric;

forming a first level of conductive wiring over said interlevel dielectric;

forming an insulating layer around said first level of conductive wiring and over interlevel dielectric;

forming sacrificial polysilicon islands over said first level of conducting wiring and insulating layer;

depositing low dielectric material over said sacrificial polysilicon islands and insulating layer;

planarizing the excess said sacrificial polysilicon islands and excess said low dielectric material;

forming sacrificial polysilicon lines over said polysilicon islands and said low dielectric material;

depositing a layer of low dielectric material over said sacrificial polysilicon lines and low dielectric;

planarizing the excess said sacrificial polysilicon lines and excess said layer of low dielectric material;

removing all of the said sacrificial polysilicon lines and islands forming dual damascene, trench interconnect and contact via openings;

filling said interconnect and via with inlaid copper, planarizing surface to remove excess metal.

2. The method of claim 1, wherein said substrate is semiconductor single crystal silicon or an IC module.

3. The method of claim 1, wherein low dielectric material layers for inverse dual damascene build are selected from the group consisting of doped oxide, organic materials, highly fluorinated films, porous materials, spin-on glass (SOG), chemical vapor deposited (CVD) glass and spin-on-dielectric (SOD), in the thickness range from approximately 3,000 to 5,000 Angstroms thick for each low dielectric material layer.

4. The method of claim 1, wherein the sacrificial material for inverse dual damascene build are selected from the group consisting of polysilicon, silicon nitride, and metal.

5. The method of claim 1, wherein the inverse dual damascene interconnect trench openings and contact via openings are formed by removing sacrificial material from the group consisting of polysilicon, silicon nitride, and metal.

6. The method of claim 1, wherein the excess sacrificial materials and excess low dielectric constant materials for inverse dual damascene build are planarized by removing the excess materials, selected from the group consisting of planarization by: chemical mechanical polish (CMP), milling, ion milling, and/or etching.

7. The method of claim 1, wherein the excess conducting copper metal for dual damascene fill is planarized by removing the excess copper conducting material, selected from the group consisting of planarization by: chemical mechanical polish (CMP), milling, ion milling, and/or etching, leaving copper dual inlaid for interconnects and contact vias.

8. The method of claim 1, wherein multilevel conducting structures are fabricating by repeating the process described herein.

9. A method for fabricating conductive inlaid copper interconnect/contact vias for applications in MOSFET and CMOS semiconductor devices using an inverse copper single damascene comprising:

providing a substrate over which is formed an interlevel dielectric;

forming a first level of conductive wiring over said interlevel dielectric;

forming an insulating layer around said first level of conductive wiring and over said interlevel dielectric;

forming sacrificial polysilicon structures over said first level of conducting wiring and said insulating layer;

depositing low dielectric constant material over said sacrificial polysilicon structures and said insulating layer;

planarizing the excess said sacrificial polysilicon. and excess said low dielectric constant material;

removing all of the said sacrificial polysilicon forming single damascene trench/via openings;

filling said trench/via openings with inlaid copper, planarizing surface to remove excess metal.

10. The method of claim 9, wherein said substrate is semiconductor single crystal silicon or an IC module.

11. The method of claim 9, wherein low dielectric constant material layer for inverse single damascene build is selected from the group consisting of doped oxide, organic materials, highly fluorinated films, porous materials, spin-on glass (SOG), chemical vapor deposited (CVD) glass and spin-on-dielectric (SOD), in the thickness range from approximately 3,000 to 5,000 Angstroms thick.

12. The method of claim 9, wherein the sacrificial material for inverse single damascene build is selected from the group consisting of polysilicon, silicon nitride, and metal.

13. The method of claim 9, wherein the inverse single damascene interconnect trench opening/contact via opening is formed by removing sacrificial material from the group consisting of polysilicon, silicon nitride, and metal.

14. The method of claim 9, wherein the excess sacrificial material and excess low dielectric constant material for inverse single damascene build is planarized by removing the excess materials, selected from the group consisting of planarization by: chemical mechanical polish (CMP), milling, ion milling, and/or etching.

15. The method of claim 9, wherein the excess conducting copper metal for single damascene fill is planarized by removing the excess copper conducting material, selected from the group consisting of planarization by: chemical mechanical polish (CMP), milling, ion milling, and/or etching, leaving copper single inlaid for interconnect/contact via.

16. The method of claim 9, wherein multilevel conducting structures are fabricating by repeating the process described herein.

17. A method for fabricating conductive inlaid interconnects and contact vias for applications in semiconductor devices using an inverse dual damascene process comprising:

providing a substrate over which is formed an interlevel dielectric;

forming a first level of conductive wiring over said interlevel dielectric;

forming an insulating layer around said first level of conductive wiring and over interlevel dielectric;

forming islands consisting of sacrificial material over said first level of conducting wiring and said insulating layer;

forming a first layer of low dielectric constant material around and over said islands and over said insulating layer;

removing the excess said sacrificial material and excess said low dielectric constant material to planarize the surface;

forming lines consisting of sacrificial material over said islands and said first layer of low dielectric constant material;

forming a second layer of low dielectric constant material around and over said lines and over the first layer of low dielectric constant material;

removing the excess said sacrificial material and excess said low dielectric material to planarize the surface;

removing all of the said sacrificial material, lines and islands, to form dual damascene, trench interconnect and contact via openings;

filling said interconnect and via openings with inlaid conducting material, planarizing the surface to remove excess conductive material.

18. The method of claim 17, wherein said substrate is semiconductor single crystal silicon or an IC module.

19. The method of claim 17, wherein low dielectric material layers for inverse dual damascene build are selected from the group consisting of doped oxide, organic materials, highly fluorinated films, porous materials, spin-on glass (SOG), chemical vapor deposited (CVD) glass and spin-on-dielectric (SOD), in the thickness range from approximately 3,000 to 5,000 Angstroms thick for each low dielectric material layer.

20. The method of claim 17, wherein the sacrificial material for inverse dual damascene build are selected from the group consisting of polysilicon, silicon nitride, and metal.

21. The method of claim 17, wherein the inverse dual damascene interconnect trench openings and contact via openings are formed by removing sacrificial material from the group consisting of polysilicon, silicon nitride, and metal.

22. The method of claim 17, wherein the excess sacrificial materials and excess low dielectric constant materials for inverse dual damascene build are planarized by removing the excess materials, selected from the group consisting of planarization by: chemical mechanical polish (CMP), milling, ion milling, and/or etching.

23. The method of claim 17, wherein the conducting material to fill the dual damascene openings for interconnect lines and contact vias is selected from the group consisting of: copper, aluminum-copper alloys, aluminum, tungsten.

24. The method of claim 17, wherein the excess conducting material for dual damascene fill is planarized by removing the excess copper conducting material, selected from the group consisting of planarization by: chemical mechanical polish (CMP), milling, ion milling, and/or etching, leaving copper dual inlaid for interconnects and contact vias.

25. The method of claim 17, wherein multilevel conducting structures are fabricating by repeating the process described herein.

26. The method of claim 17, wherein the inverse dual damascene interconnect trench openings and contact via openings are formed by removing sacrificial material from the group consisting of polysilicon, silicon nitride, and metal, using highly selective etch processing selected from the group consisting of chemical dry etching, wet etching and spin-process etching.

* * * * *